United States Patent
Suzuki et al.

(10) Patent No.: US 7,323,763 B2
(45) Date of Patent: Jan. 29, 2008

(54) SEMICONDUCTOR DEVICE HAVING AN IMPROVED VOLTAGE CONTROLLED OSCILLATOR

(75) Inventors: Satoshi Suzuki, Tokyo (JP); Takayuki Matsuzuka, Tokyo (JP); Kenichiro Chomei, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 114 days.

(21) Appl. No.: 11/175,378

(22) Filed: Jul. 7, 2005

(65) Prior Publication Data

US 2006/0006418 A1    Jan. 12, 2006

(30) Foreign Application Priority Data

Jul. 8, 2004    (JP) ............... 2004-201354

(51) Int. Cl.
*H01L 29/00* (2006.01)
(52) U.S. Cl. .............. 257/544; 257/563; 257/564; 257/E29.114; 257/E29.115; 257/E27.009; 331/177 V; 331/117 FE
(58) Field of Classification Search .......... 257/595, 257/539, 532, E27.048, 197, 378, 544, 545, 257/550, 553, 560, 561, 564, 200, 563, E29.114, 257/E29.115
See application file for complete search history.

(56) References Cited

U.S. PATENT DOCUMENTS

| | | | |
|---|---|---|---|
| 3,582,823 A | * | 6/1971 | Pasos ................ 331/96 |
| 3,657,609 A | | 4/1972 | Oswald et al. |
| 4,721,985 A | | 1/1988 | Pavlidis et al. |
| 5,220,194 A | | 6/1993 | Golio et al. |
| 5,747,857 A | * | 5/1998 | Eda et al. ............ 257/416 |
| 6,100,770 A | * | 8/2000 | Litwin et al. ........ 331/117 FE |
| 6,469,366 B1 | * | 10/2002 | Nakashima et al. ..... 257/592 |
| 6,551,890 B2 | | 4/2003 | Dekker et al. |
| 6,642,607 B2 | | 11/2003 | Ohnishi et al. |
| 6,724,270 B2 | * | 4/2004 | Kozu ................. 331/117 R |
| 2003/0122155 A1 | * | 7/2003 | Ohguro .............. 257/200 |
| 2004/0155719 A1 | | 8/2004 | Suzuki et al. |

FOREIGN PATENT DOCUMENTS

| | | |
|---|---|---|
| DE | 1 803 883 | 5/1970 |
| EP | 0 169 122 | 1/1986 |
| EP | 1 113 498 | 7/2001 |
| EP | 1 229 584 A | 8/2002 |
| JP | 2000-124473 | 4/2000 |
| WO | WO 03/098701 | 11/2003 |

\* cited by examiner

*Primary Examiner*—Theresa T. Doan
*Assistant Examiner*—Sarah K Salerno
(74) *Attorney, Agent, or Firm*—Leydig, Voit & Mayer, Ltd.

(57) ABSTRACT

A semiconductor device having an improved voltage control oscillator circuit is provided. The voltage control oscillator circuit includes, in combination, a variable-capacitance element and at least one bipolar transistor on a single semiconductor substrate. The variable-capacitance element includes reversely serially connected PN junctions, and junctions are formed by a single common collector layer and separated base layers on the common collector layer. The capacitance of the variable-capacitance element is generated between respective base layers of the PN junctions with the common collector layer, and varies in correspondence with the voltage applied to the common collector layer.

2 Claims, 5 Drawing Sheets

PRIOR ART

PRIOR ART

SEMICONDUCTOR DEVICE HAVING AN IMPROVED VOLTAGE CONTROLLED OSCILLATOR

BACKGROUND OF THE INVENTION

1. Field of the Invention

The present invention relates to a semiconductor device having an improved voltage controlled oscillator circuit formed by connecting a variable-capacitance element in combination with a bipolar transistor on a same single semiconductor substrate. More specifically, a variable-capacitance element is formed using a P layer as the base and an N layer as the collector among the NPN layers for forming a bipolar transistor.

2. Background Art

FIG. 3A shows an example of a conventional voltage control oscillator circuit formed by combining a bipolar transistor and a variable-capacity element formed on a same semiconductor substrate. FIG. 3B is a plan view showing the constitution of the variable-capacity element surrounded by broken lines in FIG. 3A; FIG. 3C is a sectional view showing the side structure along B-B line in FIG. 3B; and FIG. 3D is a small signal equivalent circuit of the variable-capacity element.

As these drawings show, when a bipolar transistor 10 and a variable-capacity element 30 are composed on the same semiconductor substrate 6, as FIG. 3C shows, an $N^+$ layer 7 is formed as a contact on the semi-insulating semiconductor substrate 6. An N layer 8 and a P layer 9 are formed thereon to be a collector and a base of an NPN transistor. A wiring 1 and a connecting wiring 3 are formed on the base layer 9, and the electrodes 2 of the collector layer 8 are formed on the contact layer 8, and wirings 5 for connecting the electrodes 2 to other circuit elements are formed on the both sides of the collector layer 8. As FIG. 3B shows, the wirings 5 connect the both electrodes 2 mutually.

Furthermore, circuit elements shown in FIG. 3A are provided on the semiconductor substrate 6 to form the voltage control oscillator circuit. Specifically, a capacitor 12 for isolating direct-current components from external circuits is connected to the base of an NPN bipolar transistor 10 that forms the active part of the oscillator circuit, and each inductor 11a and 11b that determines the feedback quantity to the bipolar transistor is connected to the capacitor 12 and the emitter of the bipolar transistor 10.

The wiring 5 connected to the collector layer 8 of a variable-capacity element 30 is connected to the inductor 11a on the base side of the bipolar transistor. The serially connected body of the control power source 13 and the choke coil 14 for isolating the alternate-current components from a control power source 13 are connected also to the inductor 11a. The reference numeral 15 denotes the output terminal of the oscillator circuit.

In such a constitution, the variable-capacity element 30 utilizes the phenomenon wherein the capacity generated between the base layer 9 and the collector layer 8 that form the PN junction varies corresponding to the variation of the voltage of the control power source 13 (e.g., see Japanese Patent Application Laid-Open No. 2000-124473).

The conventional semiconductor device is constituted as described above, and utilizes the variation of capacity generated between the base layer 9 and the collector layer 8 of the PN-junction diode as the variable-capacity element 30. In this case, however, when a forward-direction voltage is applied to the above-described PN-junction diode, the depletion layer generated from the base layer 9 toward the direction of the contact layer 7 shrinks. Therefore, the collector region, which is from the lower end of the depletion layer to the contact layer 7, expands in FIG. 3C. Accordingly, the resistance component 18, shown in FIG. 3D, which is serially connected to the resistor 16 and the capacity component of the capacitor 17 of the diode, increases, and the Q value of the resonant circuit was lowered. Thus, the noise characteristics of the voltage-controlled oscillation circuit is deteriorated.

The object of the present invention is to solve the above-described problem, and to provide a semiconductor device that can form a voltage control oscillator circuit having a variable capacity element 30, using PN junction, of a small resistance component serially connected to a capacity component on the same semiconductor substrate 6 with a bipolar transistor 10.

SUMMARY OF THE INVENTION

According to the present invention, a semiconductor device having an improved voltage control oscillator circuit is provided. The voltage control oscillator circuit comprises in combination a variable-capacity element and at least a bipolar transistor formed on a same semiconductor substrate. The variable-capacity element includes a plurality of reversely serially connected PN junctions, and the plurality of PN junctions are formed by a single common collector layer and a plurality of separated base layers formed on the common collector layer. The capacity of the variable-capacity element is generated between respective base layers of the PN junctions with the common collector layer, and varies corresponding to the voltage applied to the common collector layer.

The semiconductor device according to the present invention is composed as described above, and the resistance component in the horizontal direction between respective base layers is decreased. As a result, the serial resistance component of the variable-capacity element is decreased.

Other and further objects, features and advantages of the invention will appear more fully from the following description.

DETAILED DESCRIPTION OF THE PREFERRED EMBODIMENT

Figure 1A:
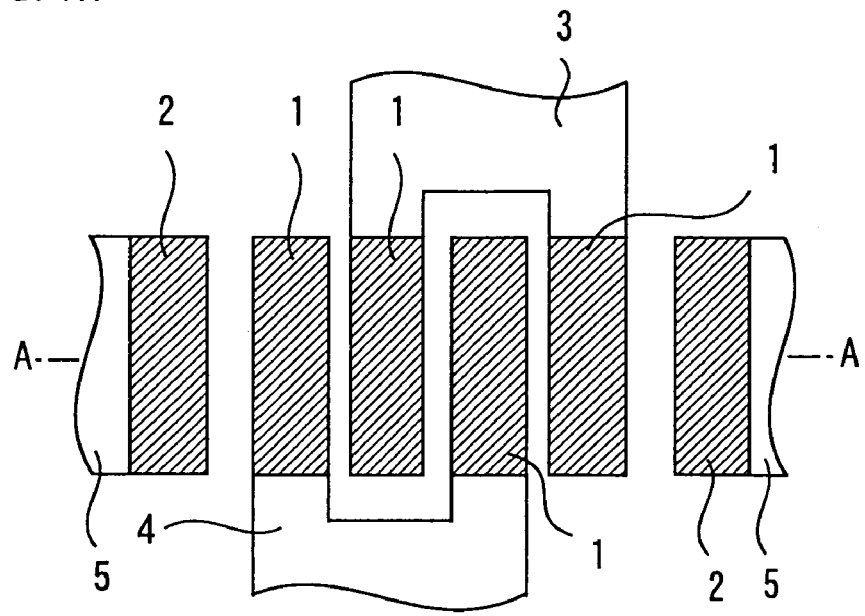
FIG. 1A is a plan view showing the constitution of a variable-capacity element in an embodiment of the present invention.
Figure 1B:
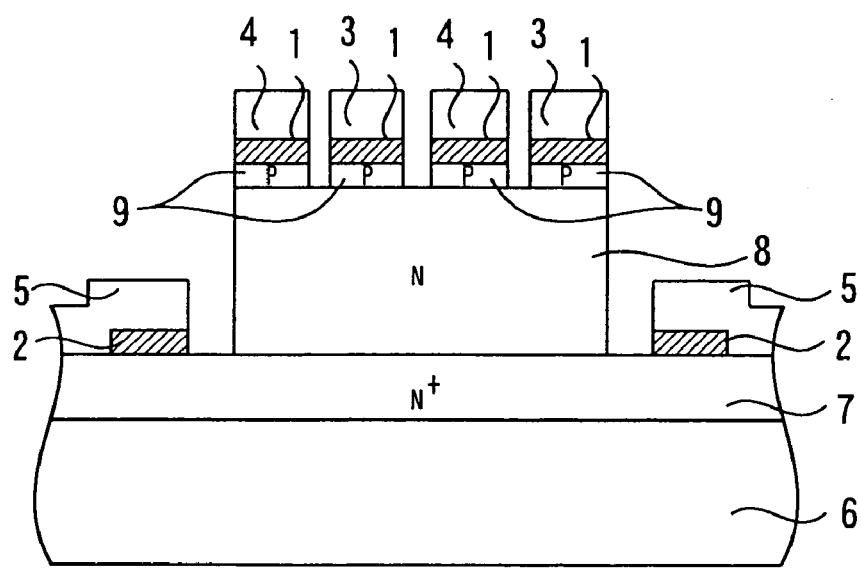
FIG. 1B is a sectional view showing the side structure along A-A line in FIG. 1A.
Figure 1C:
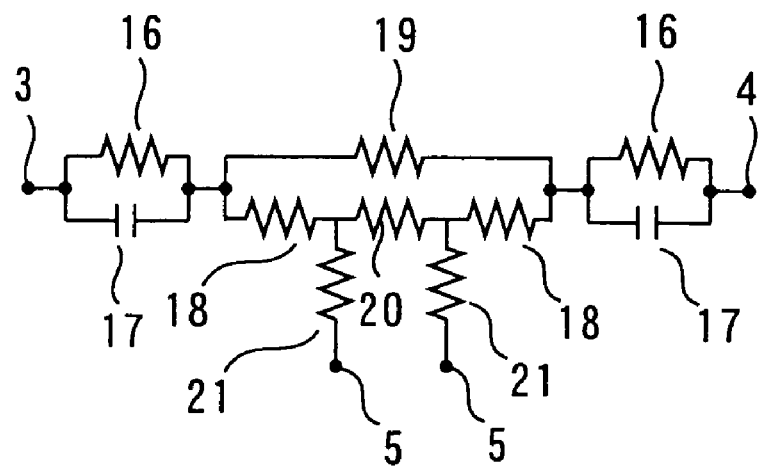
FIG. 1C is a small signal equivalent circuit of the variable-capacity element in the embodiment of the present invention.

A preferred embodiment of the present invention will be described below referring to the drawings. FIG. 1A is a plan view showing the constitution of a variable-capacity element in the embodiment; FIG. 1B is a sectional view showing the side structure along A-A line in FIG. 1A; FIG. 1C is a small signal equivalent circuit of the variable-capacity element; and FIG. 1D shows an example of the voltage control oscillator circuit formed by combining a variable-capacity element of the embodiment and an NPN bipolar transistor formed on the same semiconductor substrate.

The feature of this embodiment is that two or more electrically isolated island-like base layers are formed on a single collector layer to form two or more PN-junction diodes using semiconductor layers of a separate bipolar transistor; respective PN-junction diodes are reversely serially connected through a common collector layer; and a variable-capacitance element is constituted utilizing the phenomenon that capacitance between the terminals of PN-junction diodes varies with the voltage apply.

As FIG. 1B shows, an N+ layer 7 is formed as a contact on a semi-insulating semiconductor substrate 6. An N layer 8 and a plurality of electrically isolated P layers 9 are formed thereon to form a plurality of reversely serially connected PN-junction diodes. The N layer 8 and P layers 9 correspond to a collector layer and a base layer among the NPN layers for a transistor. On each base layer 9 of the PN-junction diodes, each electrode 1 is formed, and wirings 3 and connecting wirings 4 are formed alternately on the electrodes 1, as FIG. 1A shows, to form alternately intricate comb-like electrodes.

Figure 1D:
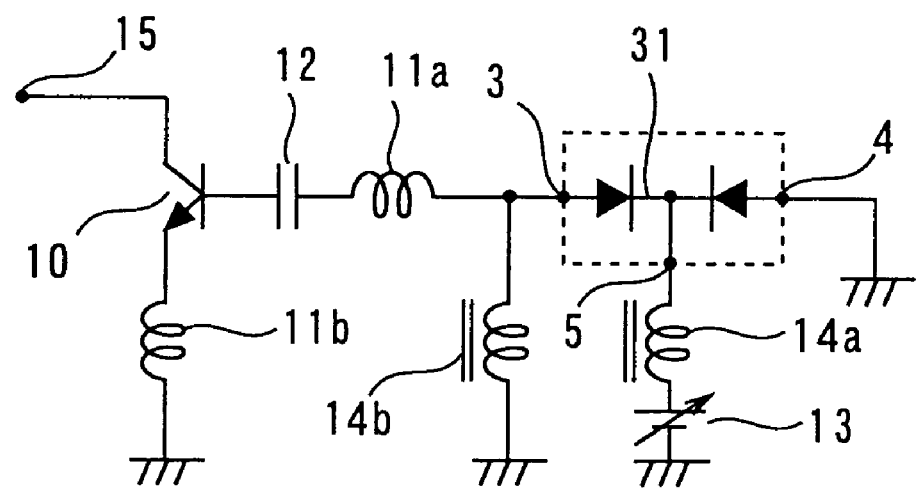
FIG. 1D shows an example of the voltage control oscillator circuit formed by combining a variable-capacity element of the embodiment and an NPN bipolar transistor formed on the same semiconductor substrate in the embodiment of the present invention.

The electrodes 2 of the collector layer 8 are formed on the contact layer 7, and wirings 5 for connecting the electrodes 2 to other circuit elements are formed on the both sides of the collector layer 8; and the wirings 5 are mutually connected, and choke coils 14a and a control power source 13 are connected to this portion as shown in FIG. 1D.

Furthermore, other circuit elements shown in FIG. 1D are mounted on the semiconductor substrate 6 to form a voltage control oscillator circuit. Specifically, a capacitor 12 for isolating direct-current components from external circuits is connected to the base of an NPN bipolar transistor 10 that forms the active part of the oscillator circuit, and each inductor 11a and 11b that determines the feedback quantity to the bipolar transistor is connected to the capacitor 12 and the emitter of the bipolar transistor 10.

Figure 3A:
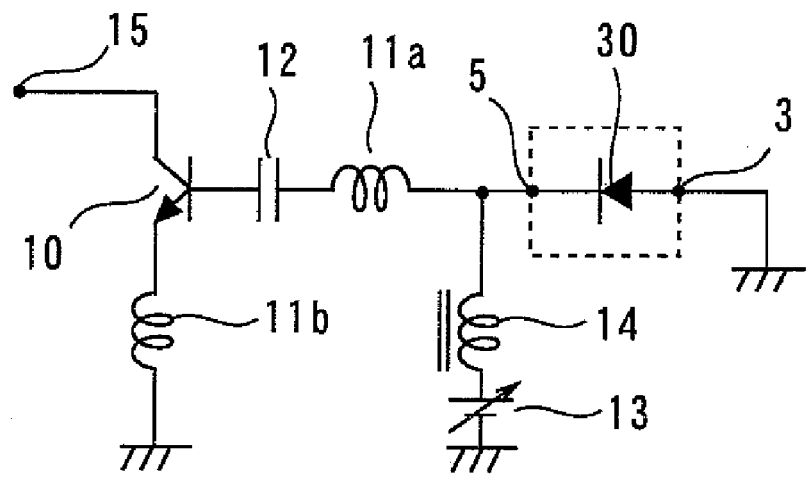
FIG. 3A shows an example of a conventional voltage control oscillator circuit formed by combining a bipolar transistor and a variable-capacity element formed on a same semiconductor substrate.
Figure 3B:
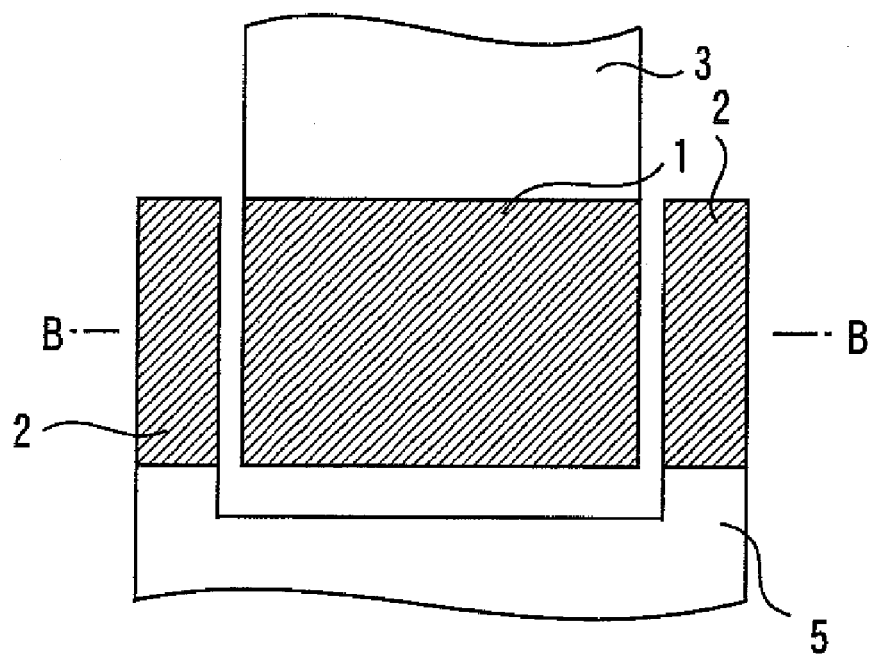
FIG. 3B is a plan view showing the constitution of the variable-capacity element surrounded by broken lines in FIG. 3A.

Since the basic constitution of the voltage control oscillator circuit is similar to the circuit shown in FIG. 3A, the same parts are denoted by the same reference numerals, and the description thereof is omitted; however, the aspects different in FIG. 1A are that the variable-capacity element 31 is formed of a plurality of reversely serially connected PN-junction diodes described in FIGS. 1A and 1B, and the wirings 3 and choke coils 14b are connected to the inductor 11a connected to the base side of the bipolar transistor 10 as shown in FIG. 1D.

In FIG. 1C, the reference numeral 16 denotes a resistance component of the PN-junction diode; 17 denotes the capacity component of the same PN-junction diode; 18 denotes a resistance component of the neutral semiconductor region in the vertical direction from the end (lower end) of the depletion layer to the contact layer 7, produced from the base layer 9 side toward the direction of the contact layer 7 in FIG. 1B. The neutral semiconductor region extends from the end of the depletion layer to the contact layer 7 of the PN-junction diode, and the reference numeral 19 denotes a resistance component of the neutral semiconductor region in the horizontal direction. That is the resistance component inversely proportional to the cross-sectional area of the collector layer 8 connected to the wirings 3 and 4, i.e., the product of "the distance from the end of the depletion layer to the contact layer 7" and "the length of the electrode 1 in the up-and-down direction" shown in FIG. 1A. The reference numeral 20 denotes the resistance of the contact layer 7; and 21 denotes the contact resistance of the collector electrode 2.

Figure 2A:
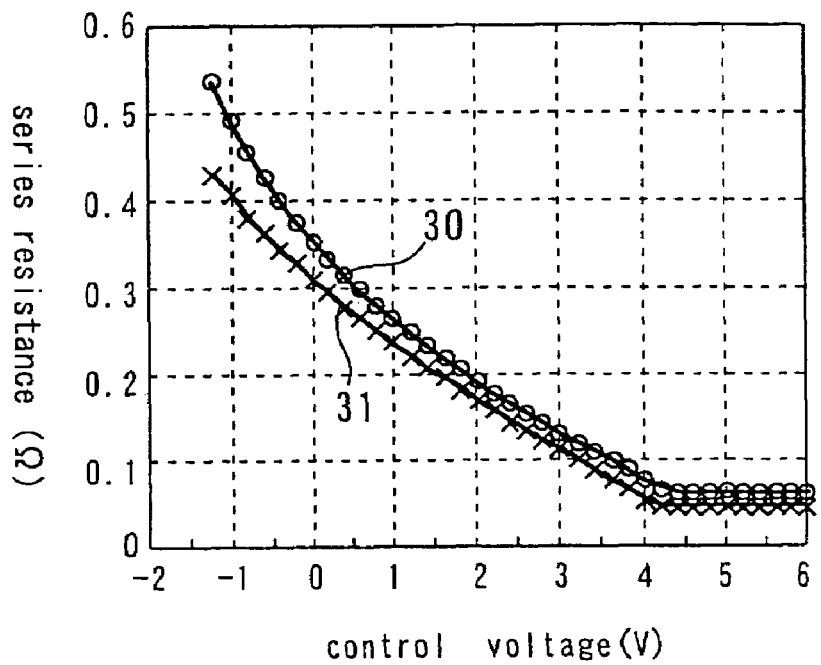
FIG. 2A is a characteristic diagram showing the aspect of change in the resistance component serially connected to the capacity component between the bases according to the embodiment of the present invention, in comparison with the aspect of change in the resistance component serially connected to the capacity component in a conventional PN-junction diode.

FIG. 2A shows a characteristic diagram comparing the aspect of change in the resistance component serially connected to the capacity component between the base wirings 3 and 4 when the base wirings 3 and 4 are grounded, and a voltage of the control power source 13 is applied to the collector wiring 5, with the aspect of change in the resistance component serially connected to the capacity component when the same capacity is realized by a conventional PN-junction diode.

Figure 3C:
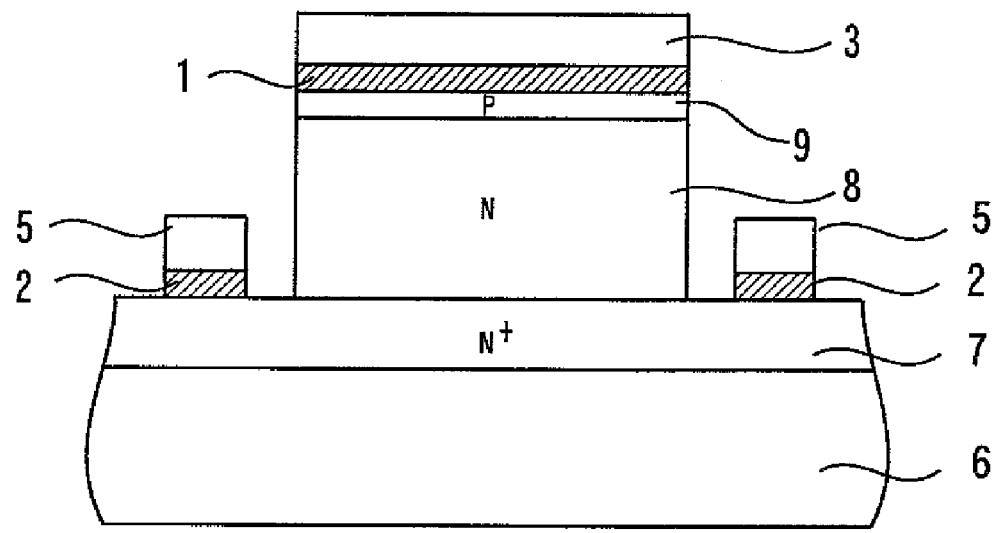
FIG. 3C is a sectional view showing the side structure along B-B line in FIG. 3B.
Figure 3D:
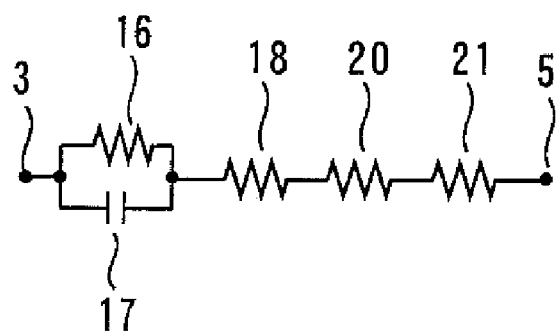
FIG. 3D is a small signal equivalent circuit of the variable-capacity element of a conventional voltage control oscillator circuit.

It is seen that in comparison with the conventional variable-capacity element 30 using the PN-junction diode, the variable-capacity element 31 in this embodiment has a lower control-voltage dependence of the resistance component serially connected to the capacity component. This is because in the conventional variable-capacity element 30 using the PN-junction diode, the width of the depletion layer shrinks in the vertical direction in FIG. 3C when a forward bias is applied between the base layer 9 and the collector layer 8, and the resistance component 18 in the vertical direction from the end of the depletion layer of the PN junction to the contact layer 7 increases, as is seen from FIG. 3D, so that the resistance component 18 serially connected to the capacitor is increased. In the variable-capacity element 31 in the present embodiment, N-type collector layers 8 and N+-type collector contact layers 7 of the two or more PN-junction diodes are common. The width of the depletion layer shrinks in the vertical direction in FIG. 1B when a forward bias is applied between the base layer 9 and the collector layer 8, and the resistance component 18 in the vertical direction of the neutral semiconductor region from the end of the depletion layer to the contact layer 7 of the PN junction is increased similarly to the conventional variable-capacity element. However, since the resistance component 19 in the horizontal direction between the wirings 3 and 4 is inversely proportional to the cross-sectional area determined by the product of "the distance from the end of the depletion layer to the contact layer 7" and "the length of the electrode 1 in the up-and-down direction in FIG. 1A", the above-described cross-sectional area expands when the width of the depletion layer shrinks. That results in decrease in the resistance component 19, and the reduction of the control-voltage dependence of the serial resistance component.

This effect utilizes decrease in the resistance component 19 in the horizontal direction. Therefore, if the electrodes 1 of the facing comb-shaped base layers 9 are disposed as shown in FIG. 1A, and the electrodes 2 of the collector layer 8 are disposed on both sides as shown in FIG. 1A so as to widen the width of the base layers 9 (the length of the electrode 1 in the up-and-down direction in FIG. 1A), or alternatively if width in the facing directions of two or more base layers 9 (wirings 3 and 4) generating capacity as shown in the sectional view of FIG. 1B, then the resistance 19 in the horizontal direction can be effectively reduced.

Figure 2B:
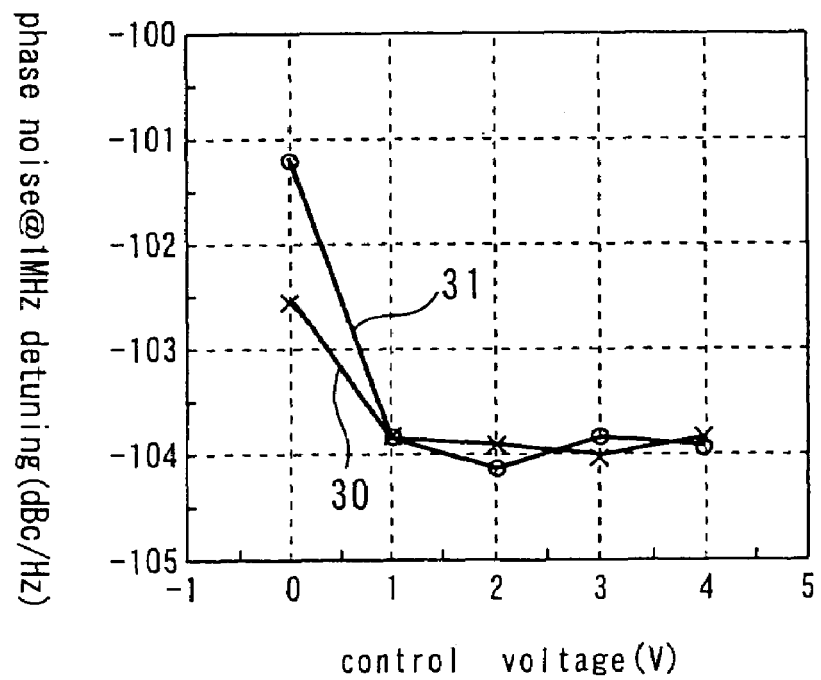
FIG. 2B is a characteristic diagram showing the phase noise characteristics of a voltage control oscillator circuit using a variable-capacity element in the embodiment of the present invention, in comparison with the phase noise characteristics of a voltage control oscillator circuit having a variable-capacity element in a conventional PN-junction diode.

FIG. 2B shows a characteristic diagram comparing the phase noise characteristics of a voltage control oscillator circuit using a variable-capacity element 31 in the present embodiment with the phase noise characteristics of a voltage control oscillator circuit having a variable-capacity element 30 utilizing the capacity variation between the anode and the cathode obtained by applying a voltage to a conventional PN-junction diode. It is seen from this characteristic diagram that the noise characteristics of the voltage control oscillator circuit using a variable-capacity element 31 in the present embodiment are superior to those using the conventional base-collector capacity element 30.

In the above-described embodiment, an example of the serial feedback-type oscillator circuit wherein a variable-capacity element 31 is connected to the base terminal of a bipolar transistor 10 is shown. Alternatively, the variable-capacity element 31 may be directly connected to either the collector terminal or the emitter terminal of the bipolar transistor 10. Further, a parallel feedback-type oscillator circuit may be obtained wherein the variable-capacity element 31 is connected between any two of the emitter, the base, and the collector terminals of the bipolar transistor 10. The same action and effect may be expected from these variations.

In the above-described embodiment, an example is shown wherein a choke coil 14a is used as an element for isolating alternate-current components from the control power source 13. It will be obvious that a resistor may be used as an element for isolating alternate-current components from the control power source 13.

The present embodiment is constituted as described above, and a variable-capacity element having little parasitic resistance component can be realized using a bipolar transistor structure. By combining the variable-capacity element and the bipolar transistor on the same semiconductor substrate, a voltage control oscillator circuit having low noise can be obtained.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2004-201354, filed on Jul. 8, 2004 including specification, claims, drawings and summary, on which the Convention priority of the present application is based, are incorporated herein by reference in its entirety.

The invention claimed is:

1. A semiconductor device comprising:
    a substrate;
    a bipolar transistor on the substrate and including parts of opposite conductivity type collector and base layers that are stacked on the substrate;
    a variable capacitance element on the substrate and comprising at least first, second, and third PN junctions, each of the first, second, and third PN junctions including a part of the collector layer and respective first, second, and third parts of the base layer, wherein
    the first, second, and third parts of the base layer of the first, second, and third PN junctions are physically separated from each other so that the first, second, and third parts of the base layer provide respective first terminals of first, second, and third diodes that respectively include the first, second, and third PN junctions,
    the collector layer of the first, second, and third PN junctions provides a common connection to the first, second, and third diodes,
    the first and third parts of the base layer of first and third PN junctions provide respective first terminals of the first and third diodes which are connected serially and in reverse polarity, and
    the first, second, and third parts of the base layer of the first, second, and third PN junctions are arranged along a straight line and the second part of the base layer is between the first and third parts of the base layer;
    a first electrode having a comb shape and electrically connecting together the first terminals of the first and third PN junctions; and
    a second electrode at least partially disposed between parts of the first electrode and electrically connected to the first terminal of the second PN junction, wherein the second electrode is physically separated from the first electrode.

2. The semiconductor device according to claim 1, further including passive electrical elements on the substrate and connected to the bipolar transistor and the variable capacitance element in a voltage controlled oscillator circuit, the voltage controlled oscillator circuit including a variable voltage terminal connected to the part of the collector layer of the PN junctions for applying a variable voltage to vary the capacitance of the variable capacitance element.

* * * * *